(12) United States Patent
Tregoat et al.

(10) Patent No.: US 6,584,807 B1
(45) Date of Patent: Jul. 1, 2003

(54) METHOD OF FABRICATING A COMPONENT WITH CRYSTALLINE SILICON SUBSTRATE

(75) Inventors: Denis Tregoat, Gif sur Yvette (FR); Claude Artigue, Bourg la Reine (FR); Christian Brot, Leuville sur Orge (FR); Franck Mallecot, Montrouge (FR); Francis Poingt, Sainte Genevieve Des Bois (FR)

(73) Assignee: Alcatel N.V., Rijswijk (NL)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/822,642

(22) Filed: Mar. 24, 1997

(30) Foreign Application Priority Data

Mar. 25, 1996 (FR) .............................................. 96 03675

(51) Int. Cl.⁷ .............................................. C03B 20/00
(52) U.S. Cl. ....................................................... 65/386
(58) Field of Search ........................................... 65/386

(56) References Cited

U.S. PATENT DOCUMENTS

| 5,059,475 A |   | 10/1991 | Sun et al. |
| 5,239,601 A | * | 8/1993  | Dennis ......................... 385/49 |
| 5,297,228 A | * | 3/1994  | Yanagawa ..................... 385/49 |
| 5,299,276 A |   | 3/1994  | Okamura et al. |
| 5,385,594 A |   | 1/1995  | Kanamori et al. |
| 5,557,695 A | * | 9/1996  | Yamane ........................ 385/49 |

FOREIGN PATENT DOCUMENTS

| EP | 0716321 A1 | 6/1996 |
| JP | 452606 | 2/1992 |

* cited by examiner

*Primary Examiner*—John Hoffmann
(74) *Attorney, Agent, or Firm*—Sughrue Mion, PLLC

(57) ABSTRACT

A method of fabricating a component having a crystalline silicon substrate includes the steps of depositing a layer of silica onto a crystalline silicon substrate, this silica layer being doped with dopants, and then treating the substrate. Before the doped silica layer is deposited, a barrier layer is formed on the substrate, consisting of a barrier material opposing diffusion of the dopants. The doped silica layer is deposited onto this barrier layer. The invention finds one particular application in connecting flat bundles of fibers in communication networks.

16 Claims, 4 Drawing Sheets

METHOD OF FABRICATING A COMPONENT WITH CRYSTALLINE SILICON SUBSTRATE

BACKGROUND OF THE INVENTION

1. Field of the Invention

The present invention finds one particular application in connecting a flat bundle of optical fibers to an integrated optical device.

2. Description of the Prior Art

One method for making such connections that is known in itself uses a flat bundle of planar waveguides formed for this purpose in layers of doped silica deposited onto a silicon substrate. At the same time housings are hollowed into the substrate with surfaces that follow crystal planes of the substrate and therefore enable accurate location of the optical fibers to couple them to the respective planar waveguides. This method that is known in itself is described in more detail in the remainder of the present description. It has the disadvantage that it does not produce good optical coupling between planar waveguides and the optical fibers when it is required to deposit the layers of silica by a relatively low cost method of deposition that is known in itself. The present invention is a result of discovering the causes of this drawback and consequently provides a remedy to this drawback. Nevertheless, it seems that these causes can give rise to similar disadvantages in other circumstances and that the same remedy can then be used with advantage. This is why the invention is first described hereinafter in a more general manner and then in one particular application.

SUMMARY OF THE INVENTION

Firstly, the invention consists in a method of fabricating a component having a crystalline silicon substrate, the method including the steps of:

depositing a layer of silica onto a crystalline silicon substrate, this silica layer being doped with dopants, eliminating said doped silica layer over a region to be treated of said substrate, and treating said substrate in said region to be treated so that the quality of the fabricated component is conditioned by the quality of the crystal lattice of said substrate in said region. This treatment can be of various kinds, as explained hereinafter. Regardless of the nature of the treatment, before the deposition of said layer of doped silica, the method includes a step of forming on said substrate a barrier layer of a barrier material opposing diffusion of said dopants, said doped silica layer being deposited onto said barrier layer at a high temperature such as that of flame hydrolysis, said barrier layer being eliminated in said region to be treated before said treatment step.

The barrier material is preferably a silica containing none of said dopants, at least those of the dopants of the doped silica layer that could degrade the useful qualities of the substrate. This silica is typically pure silica. The barrier layer is then advantageously formed by oxidation of the substrate. This layer can be made 400 nm thick by exposing the substrate to an oxygen atmosphere at 1350° C. for 1 h, for example. However, this layer could equally well be formed by the flame hydrolysis deposition (FHD) process or by the plasma enhanced chemical vapor deposition (PECVD) process. At least one other barrier material may be used: silicon nitride.

This invention finds typical applications in the fabrication of optical and electro-optical components, the doped silica being used to guide light waves, the crystalline silicon being used for its optical, electrical, thermal conduction or ease of etching properties. The invention is in particular a result of the fact that it has been found that the crystal lattice of the silicon can be gravely disrupted by the diffusion of dopants which, in methods of fabricating optical components that are known in themselves, are included in a layer of silica deposited onto a silicon substrate. It is also a result of the fact that the rates of diffusion of such dopants are much lower in the barrier materials proposed than in silicon, for example one hundred times lower in the case of silica. These rates increase with temperature and, for the usual dopants, they become high only above 1000° C. The present invention therefore finds applications when the substrate carrying the layer of doped silica must or can be heated to a high temperature at a time when treatment that necessitates good crystalline qualities of the substrate has not yet been carried out.

The invention will be usefully employed in certain industrial processes in which a step of treatment of this kind of a crystalline silicon substrate is prevented or merely rendered ineffective, difficult or costly when the substrate has been covered with a layer of doped silica. These processes are those in which the temperature reached during deposition of the doped silica causes diffusion into the silicon of dopants from this layer and in which such diffusion in turn causes degradation of the qualities that it is intended to exploit. In this context, the important characteristics include:

the natures of said dopants and their required concentrations in the layer of doped silica, and the foreseeable temperatures to which the substrate is exposed and the foreseeable time periods for which it is exposed to such temperatures, and the nature and the methods of the treatment to be effected.

Insofar as the natures and the concentrations of the useful dopants are required, boron and phosphorus may be cited in concentrations in the order of one molar percent relative to the silica. The function of these dopants is to reduce the viscosity of the silica to enable its temperature of use to be reduced or to enable the refractive index of the silica to be modified, for example. This index is reduced by approximately $5 \times 10^{-4}$ for each molar percentage point in the case of boron or phosphorus.

Other dopants that can be used for other functions include germanium, titanium, fluorine, chlorine, nitrogen, etc.

Where the foreseeable temperatures are concerned, it may be mentioned that the present invention enables the layer of doped silica to be deposited by the FHD process. This process, which is known in itself, has the advantage of being relatively economical but the disadvantage of heating the substrate to a temperature of 1350° C. for one hour. A significant temperature rise could also be required if the FHD process were replaced with the PECVD process, for example.

Where the treatment to be effected on the substrate is concerned, a typical treatment is guided etching, said region to be treated then being a region to be etched. Etching of this kind is effected by exposing the substrate to an etchant that is "guided" in the sense that the silicon is preferentially etched by the etchant parallel to the crystal planes of the substrate, so that the etching is guided by these planes. The etching rate is then typically much higher parallel to these planes than perpendicular to them. This etching exposes one or more crystal planes to exploit the fact that these planes have precisely defined relative orientations.

Using this typical method, the barrier layer is formed on a plane surface oriented along a crystal plane of the substrate. After elimination of the layer of doped silica and of the barrier layer over at least the region to be etched of this plane face, the etching processing steps are as follows:

definition of a guided etchant adapted to etch the substrate in a manner guided by crystal planes of the substrate, application to this region to be etched of a layer resistant to said guided etchant and having at least one definition edge oriented in a crystal direction of the substrate, and then exposing said plane face to said guided etchant to expose at least one crystal plane of the substrate from said definition edge, this plane forming a non-zero dihedral angle with this face. There is typically formed in this way, between two crystal planes exposed in this way, a locating Vee enabling precise orientation of an optical fiber on a silicon substrate. Crystal planes exposed in this way could have other functions, however, for example they could constitute mirrors to reflect infrared light guided in a layer of silica formed on the substrate.

In the case of another kind of treatment to be effected on the substrate, electrically conductive tracks, for example gold tracks, are formed on the latter to energize an active component such as a laser attached to the substrate. The dielectric constant of the material of the substrate must then be homogeneous and predictable. It has been found that this constant is seriously and erratically modified by the presence of impurities disrupting the crystal lattice. Consideration may also be given to the use of the semiconductor properties of the crystalline silicon.

One embodiment of the present invention is described hereinafter with reference to the accompanying diagrammatic drawings. If an item appears in more than one figure, it is always designated by the same reference symbol. The photosensitive resins employed are not shown.

DETAILED DESCRIPTION OF THE PREFERRED EMBODIMENT

Figure 1:
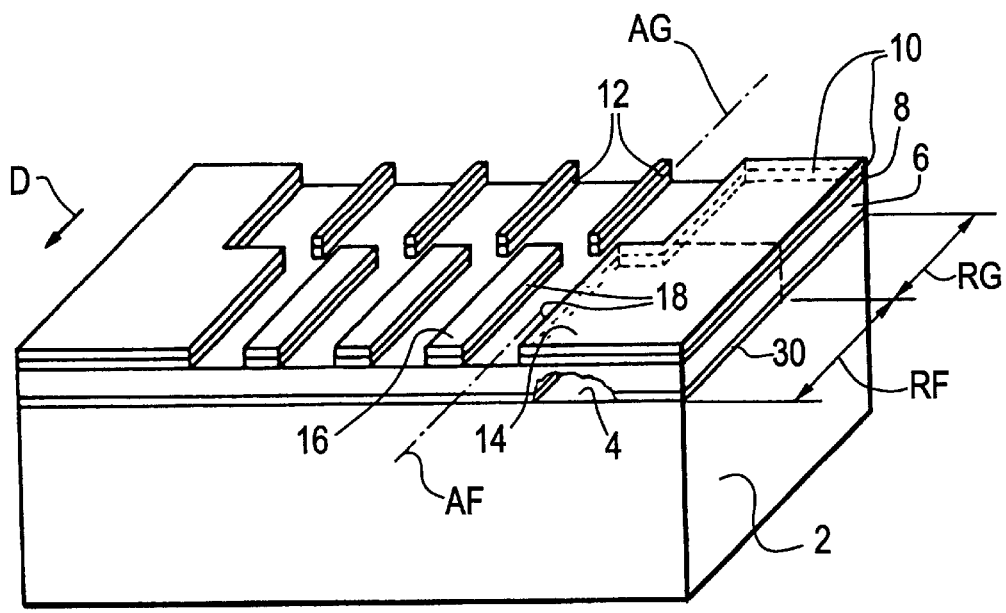
FIGS. 1 through 7 show successive steps of the method of the invention.

The application described by way of example is a method of fabricating a planar waveguide to be connected to an optical fiber. A method for this known in itself and previously referred to includes the following steps that are also employed in the context of the invention:

Formation of a substrate 2 made up of crystalline silicon and having a top face 4 oriented in a crystal plane of the substrate, a crystal direction of the substrate being oriented in this crystal plane and constituting a longitudinal direction D, two longitudinally successive regions of this top face respectively constituting a guide region RG and a fiber region RF.

Deposition, on said top face 4 of a layer 6 of doped silica, said layer 6, constituting a bottom confinement layer and including dopants which lower the refractive index of the silica. For example, this layer is 0.02 mm thick and the silica is doped with boron oxide in a molar concentration of 10% to give it a refractive index of 1.445 for transmitting light at a wavelength of 1300 nm.

Depositing, on said bottom confinement layer 6 of a doped silica, a core layer 8 made up of silica having a refractive index higher than that of said doped silica. For example, this layer is 0.007 mm thick and is made up of silica with a majority doping of germanium oxide in a molar concentration of 3%. It therefore has a refractive index of 1.450 for the light to be transmitted.

Deposition, onto said core layer 8, a complete protective layer 10. This layer is conventionally chromium.

Etching of said complete protective layer 10 so that the remaining parts of this layer constitute a limited protective layer including guide core protection strips 12 in said guide region RG and two housing definition strips 14, 16 in said fiber region RF. Each core protection strip 12 has a longitudinal axis AG. The two housing definition strips 14, 16 define between them a fiber housing strip having two longitudinal edges 18 constituting two housing definition edges and extending symmetrically on either side of an axis AF aligned with the axis of a guide core protection strip 12. This etching of the chromium protective layer is effected by conventional photolithography, and likewise other subsequent etches, by depositing a photosensitive resin, exposing the resin through an exposure mask, developing the resin by selective washing to eliminate it according to whether it was exposed or not, and then etching with an etchant such that the remaining parts of the resin resist etching. The chromium layer is conventionally etched using a standard solution such as that sold by Shipley under the registered trademark "Chrome-etchant".

The remaining photosensitive resin is not eliminated immediately. The resin used for this etching will be referred to hereinafter as the "first resin".

Elimination of said core layer outside said limited protective layer. The silica etchant used is such that the first photosensitive resin still in place resists this etchant. The etching is limited to spare the bottom confinement layer under the core layer. For example, reactive ion etching is used assisted by a low-pressure plasma of a fluorinated gas such as $CHF_3$ or $C_2F_6$. The outcome of this etching is shown in FIG. 1. This etching of the core layer 8 forms the core 20 of the future planar waveguide in the guide region, the core being visible in FIG. 2.

After this etching the first resin and the protective layer 10 are removed completely.

Depositing an etching stop layer 22 of silicon 300 nm thick, for example.

Figure 2:
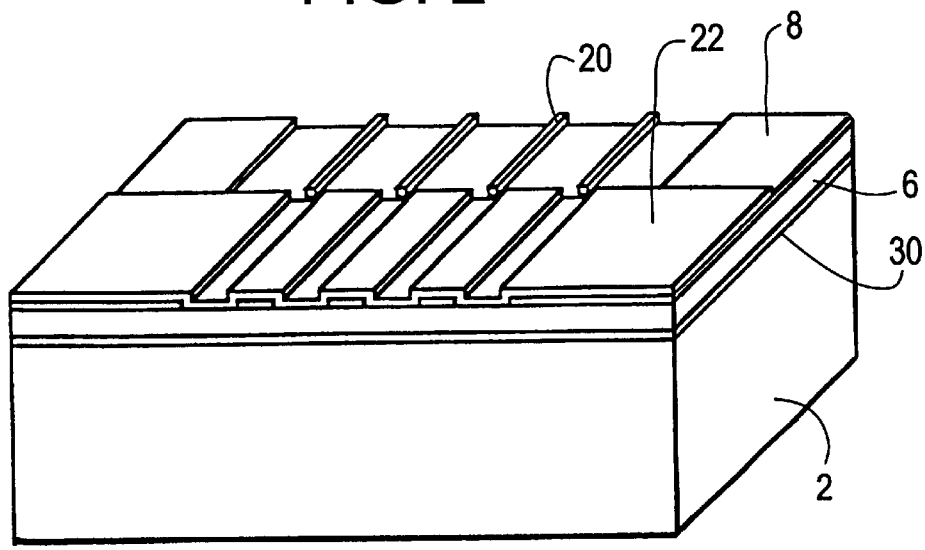

Elimination of said etching stop layer in said guide region. This elimination is effected by photolithographic etching using a second photosensitive resin eliminated by development in the guide region. The outcome of this elimination step is shown in FIG. 2.

Figure 3:
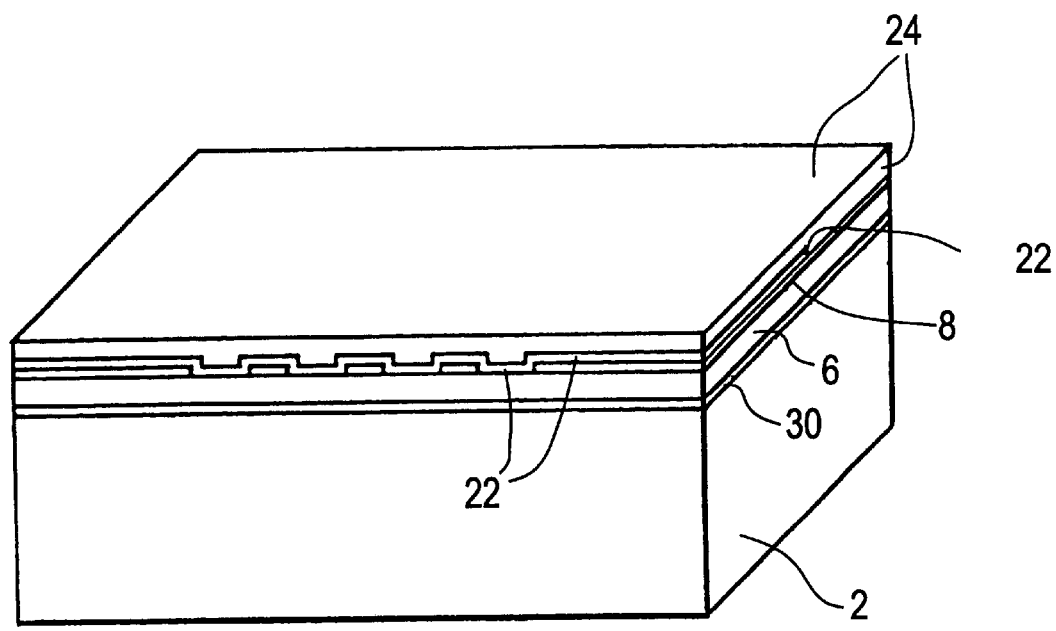

Deposition of a layer of doped silica constituting a top confinement layer 24 including dopants reducing the refractive index of the silica. This layer is deposited in exactly the same way as the bottom confinement layer 6. In the guide region, the guide core and the bottom and top confinement layers constitute the planar waveguide. The outcome is shown in FIG. 3.

Figure 4:
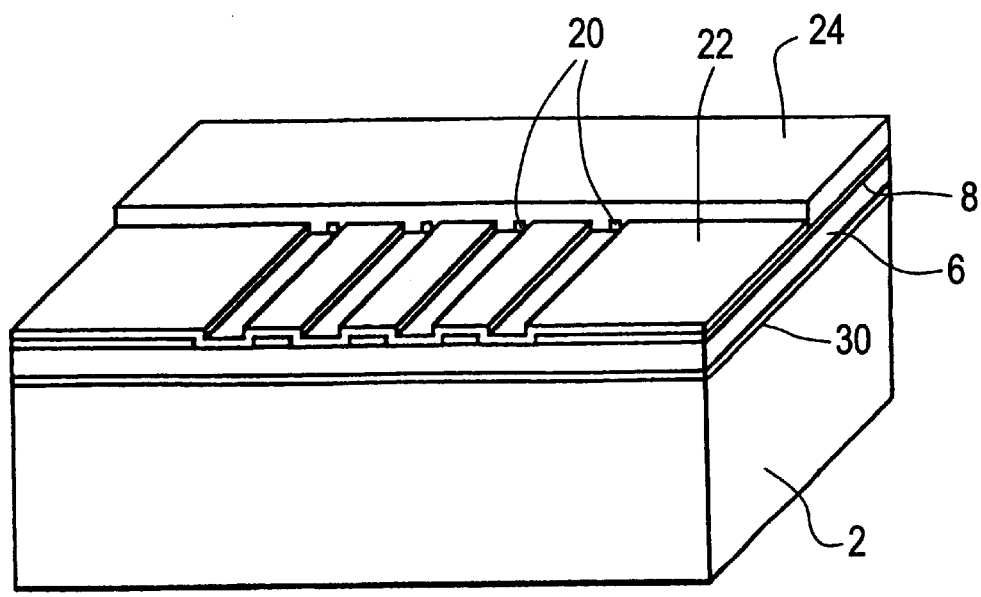

Etching of the top confinement layer to eliminate it in the fiber region. This is again a photolithographic process. It is effected by means of a third resin that development eliminates in the fiber region. The reactive ion etching (RIE) is stopped by the etching stop layer. The third resin is then completely eliminated, the outcome being shown in FIG. 4.

Elimination of the etching stop layer by reactive ion etching assisted by a low-pressure plasma of sulfur hexafluoride $SF_6$. This etching can instead be effected using a dilute solution of potassium hydroxide KOH applied for approximately one minute.

Deposition and growth of a fourth resin to protect the guide region.

Limited etching of the silica in the fiber region. The etchant used is anisotropic, i.e. the etching is effected in the vertical direction. The etching process is reactive ion etching, for example.

Figure 5:
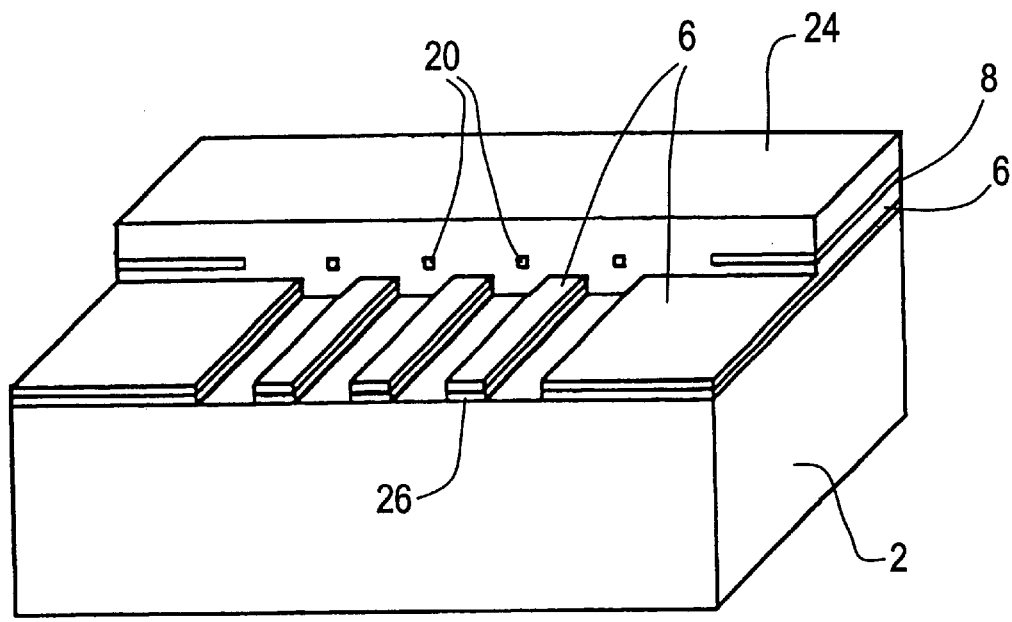

Etching is stopped when the silicon substrate is exposed in said housing strip. A silica layer 26 therefore remains in the housing definition strips. The outcome is shown in FIG. 5.

Figure 6:
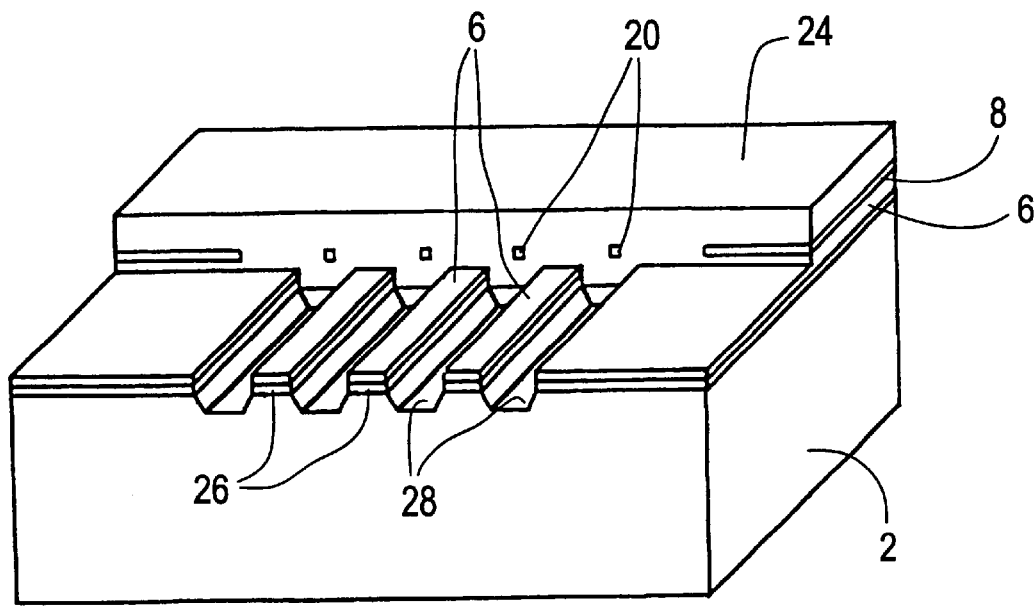

Etching of the substrate by an etchant guided by crystal planes of the substrate. The purpose of this etching is to hollow out a housing 28 for an optical fiber in said housing strip, this housing having two flanks consisting of two respective crystal planes of the substrate. These planes pass through said two housing definition edges. The silica layer 26 remaining in the housing definition strips resists the guided etchant. The housing obtained typically has a truncated V-shape cross-section and constitutes a locating Vee as previously defined. The optical fiber that it locates is aligned with the planar waveguide in a horizontal plane by the fact that the exposure mask used in etching of the protective layer has defined two precisely aligned axes, one for the core protection strip and the other for the fiber housing strip. In the vertical direction, correct positioning of the fiber is obtained by virtue of an appropriate corresponding relationship between the thickness of the bottom confinement layer and the width of the fiber housing strip. Good coupling can therefore be obtained between the optical fiber positioned in this way and the planar waveguide. This etching of the substrate is conventionally carried out using an aqueous solution of potassium hydroxide at a concentration of 190 g per liter applied for 90 minutes at a temperature of 75° C. The outcome of this etching is shown in FIG. 6.

Total elimination of the silica in the fiber region.

Figure 7:
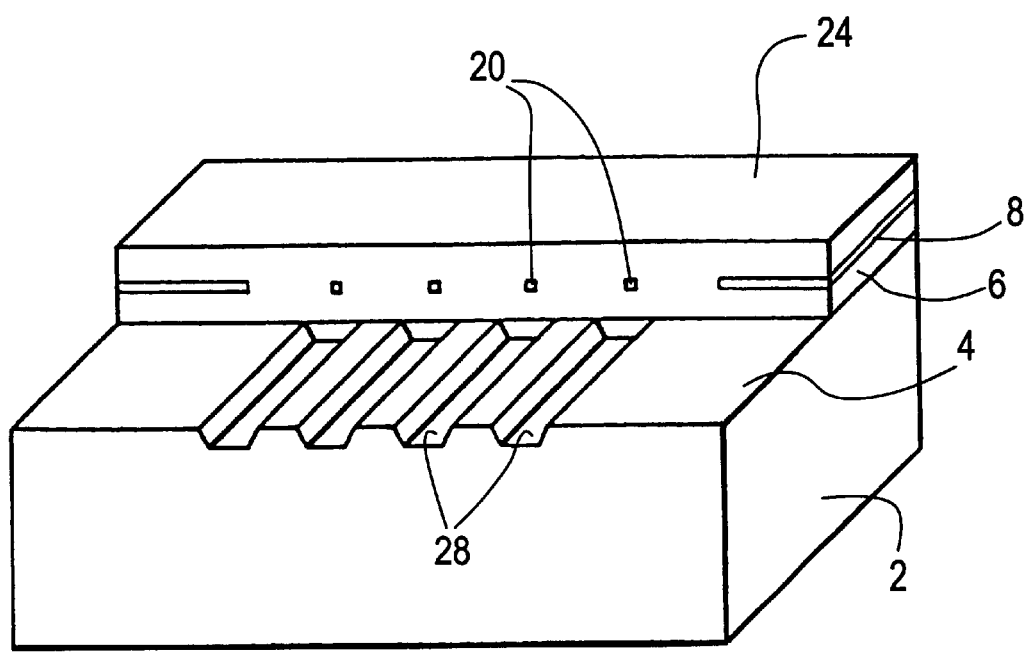

Finally, total elimination of the fourth resin, the outcome being shown in FIG. 7.

In practise, a plurality of planar waveguides and a plurality of housings for a flat bundle of a plurality of optical fibers to be connected to the respective waveguides are formed simultaneously on the same top face of a substrate. Most of the housing delimiting strips are therefore common to two adjacent housings and located between the two housings.

The quality of the optical coupling obtained after use of the fabrication method that is known in itself which has just been described is not always good. It has been found that it depends on the deposition process used to form the silica layer, i.e. the two confinement layers and the core layer. Of the processes for effecting such deposition that are known in themselves, the plasma enhanced chemical vapor deposition (PECVD) process has the disadvantage that it is more costly to implement than the flame hydrolysis deposition (FHD) process. Nevertheless, the PECVD process has been preferred since experience has shown that the good optical coupling is obtained only if the PECVD process is used. In accordance with the present invention, it has been found that the optical coupling defects that experience had shown to exist after using the FHD process were related to the relatively high temperatures (1350° C.) involved in this process and to the dopants such as phosphorus and boron included in the bottom confinement layer. To be more specific, it has been found that these defects were the result of the fact that the dopants diffused so quickly into the silicon at high temperature that they seriously disrupted the crystal lattice of the silicon in the vicinity of the top face of the substrate. They then prevented the step of etching the substrate to expose the appropriate crystal plane.

One aim of the present invention is to make the use of the FHD silica deposition process compatible with good optical coupling. In accordance with this invention, before said step of depositing the bottom confinement layer, a barrier layer 30 opposing diffusion of said dopants is formed on said top face 4. It would seem that the thickness of this layer must be between 100 nm and 2000 nm, preferably between 200 nm and 1000 nm. The manner in which a barrier layer of this kind can be formed has been described hereinabove. For example, it is a layer of pure silica 400 nm thick formed by oxidation. The other silica layers are then formed without difficulty by the FHD process.

What is claimed is:
1. In a method for fabricating a component on a crystalline silicon substrate and for giving a quality to said component, said method comprising the steps of:
depositing a doped silica layer onto a silicon substrate having a crystal lattice, said doped silica layer being doped with dopants and constituting a bottom confinement layer, said crystal lattice having a quality depending on disruptions therein;
eliminating said doped silica layer over a region to be treated of said substrate; and
treating said silicon substrate in said region to be treated so that said quality of said component depends on said quality of said crystal lattice in said region to be treated, the improvement comprising the additional steps of:
before said step of depositing said doped silica layer, forming, between said silicon substrate and said doped silica layer, a barrier layer of a barrier material opposing diffusion of said dopants, said barrier material having a lower rate of diffusion of said dopants than silicon; and
after said step of eliminating said doped silica layer and before said step of treating said substrate, eliminating said barrier layer over said region to be treated.
2. The method claimed in claim 1 wherein said barrier material is silica containing none of said dopants.
3. The method as claimed in claim 1, wherein said step of forming the barrier layer comprises oxidizing a predetermined thickness of said silicon substrate.
4. The method claimed in claim 1, wherein said barrier material is silicon nitride.
5. The method claimed in claim 1, wherein said barrier layer has a thickness between 100 nm and 2000 nm.
6. The method claimed in claim 5 wherein said thickness is between 200 nm and 1000 nm.
7. The method claimed in claim 1, wherein said crystal lattice of said silicon substrate forms crystal planes and crystal directions of said silicon substrate; and
wherein:
said method comprises, before said step of forming a barrier layer, the additional step of forming a top face (4) of said silicon substrate along a first of said crystal planes including one of said crystal directions, said one crystal direction being parallel to another of said crystal planes of said silicon substrate forming a non-zero dihedral angle with said top face, thereby said first and said another of said crystal planes constituting tilted crystal planes;

said region to be treated is a region to be etched of said top face and has at least one edge (18) parallel to said one crystal direction of said silicon substrate, said at least one edge respectively constituting at least one definition edge;

said steps of forming a barrier layer (30) and of depositing a doped silica layer (6) are performed on said top face; and said step of treating said silicon substrate includes the steps of:

defining a guided etchant for etching said silicon substrate in a manner guided by any of said tilted crystal planes;

forming on said top face outside said region to be etched a guided etchant resistant layer (26) resistant to said guided etchant and limited by said at least one definition edge; and then exposing said top face to said guided etchant to expose at least one of said tilted crystal planes respectively from said at least one definition edge in said region to be etched.

8. The method claimed in claim 7, wherein:

said method includes fabricating a planar waveguide to be connected to an optical fiber;

said crystal direction constitutes a longitudinal direction;

two longitudinally successive regions of said top face (4) respectively constitute a guide region (RG) for including said planar waveguide and a fiber region (RF) for receiving said optical fiber; and said method comprises the following steps performed on said top face:

said step of forming said barrier layer (30);

said step of depositing a doped silica layer, said dopants reducing the refractive index of the silica, said doped silica layer constituting a bottom confinement layer (6);

a step of depositing onto said bottom confinement layer a guide core layer (8) of silica having a refractive index higher than that of said bottom confinement layer;

a step of depositing onto said guide core layer a protective layer (10);

a step of etching away selected parts of said protective layer so that remaining parts thereof constitute a limited protective layer including in said guide region a guide core protection strip (12) having a longitudinal axis (AG) and in said fiber region two housing definition strips (14, 16) leaving between them a fiber housing strip having an axis (AF) aligned with said axis of said guide core protection strip, said fiber housing strip constituting said region to be etched and having two longitudinal edges respectively constituting two housing definition edges;

a step of eliminating said guide core layer selectively outside said limited protected layer, thereby forming a core (20) of said planar waveguide in said guide region, and leaving a part of said guide core layer in each of said two housing definition strips in said fiber region;

a step of eliminating said limited protective layer;

a step of depositing an etching stop layer (22);

a step of selectively eliminating said etching stop layer in said guide region;

a step of depositing a second doped silica layer having a refractive index lower than that of said guide core layer and constituting a top confinement layer (24);

a step of selectively eliminating said top confinement layer in said fiber region, thereby exposing said etching stop layer;

a step of eliminating said etching stop layer;

said step of defining a guided etchant;

said step of forming a guided etchant resistant layer which step is performed by etching said guide core layer, said bottom confinement layer and said barrier layer in a selective manner for exposing said silicon substrate in said fiber housing strip while leaving at least a part of a thickness of said barrier layer in each of said housing definition strips (14, 16) so as to constitute therein said guided etchant resistant layer (26); and said step of exposing said top face to said guided etchant to expose in said fiber housing strip two of said tilted crystal planes from said two definition edges (18), respectively, thereby hollowing out for said optical fiber a housing (28) having two flanks respectively constituted by said tilted crystal planes.

9. The method claimed in claim 8, wherein the method further comprises simultaneously fabricating on the top face (4) a plurality of planar waveguides (20) and a plurality of housings (28) for a plurality of optical fibers to be connected to the respective ones of said waveguides.

10. The method claimed in claim 7, wherein said temperature is approximately 1350° C.

11. The method claimed in claim 1, wherein said temperature is greater than 1000° C.

12. The method claimed in claim 1, wherein said dopants include at least one of boron and phosphorus.

13. The method claimed in claim 1, wherein said dopants are selected from the group consisting of germanium, titanium, fluorine, chlorine and nitrogen.

14. The method claimed in claim 1, wherein said barrier material is pure silica.

15. The method as claimed in claim 1 wherein said step of depositing said doped silica layer is performed by depositing said doped silica layer onto said barrier layer at a temperature which would cause diffusion of said dopants from said doped silica layer into said silicon substrate if said barrier layer was not formed on said silicon substrate.

16. The method as claimed in claim 1, wherein said barrier layer is formed on said silicon substrate.

* * * * *